United States Patent
Hsu (10) Patent No.: US 9,500,692 B2
(45) Date of Patent: Nov. 22, 2016

(54) DETECTING CIRCUIT AND DETECTING METHOD FOR DETERMINING CONNECTION STATUS BETWEEN FIRST PIN AND SECOND PIN

(71) Applicant: Realtek Semiconductor Corp., HsinChu (TW)

(72) Inventor: Heng-Chia Hsu, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 123 days.

(21) Appl. No.: 14/327,521

(22) Filed: Jul. 9, 2014

(65) Prior Publication Data

US 2015/0015271 A1    Jan. 15, 2015

(30) Foreign Application Priority Data

Jul. 11, 2013   (TW) .............................. 102124992 A (51) Int. Cl.
*G01R 31/02* (2006.01)
*G01R 31/04* (2006.01)
*H03K 19/20* (2006.01)

(52) U.S. Cl.
CPC .............. *G01R 31/04* (2013.01); *H03K 19/20* (2013.01)

(58) Field of Classification Search
CPC  G01R 31/04; G01R 31/046; G01R 31/2812; G01R 31/31717; G01R 31/318516; G01R 31/3191; G01R 31/31937; G05B 19/0425; G05B 2219/24036; H02H 9/001; H02H 9/02

USPC .................................................. 324/538, 73.1
See application file for complete search history.

(56) References Cited

U.S. PATENT DOCUMENTS

| | | | |
|---|---|---|---|
| 4,791,359 A | 12/1988 | Raymond | |
| 5,504,432 A | 4/1996 | Chandler | |
| 6,594,797 B1 | 7/2003 | Dudley | |
| 2009/0079440 A1* | 3/2009 | Williamson | ....... G01R 31/2812 324/612 |

FOREIGN PATENT DOCUMENTS

| CN | 101458289 A | 6/2009 |
|---|---|---|
| CN | 102565621 A | 7/2012 |

* cited by examiner

*Primary Examiner* — Vincent Q Nguyen
(74) *Attorney, Agent, or Firm* — Winston Hsu; Scott Margo (57) ABSTRACT

A detecting circuit for determining a connection status between a first pin and a second pin includes a signal generation unit, a logic unit and a determining unit. The signal generation unit is coupled to the first pin, and arranged for generating a first signal to the first pin. The logic unit is coupled to the signal generation unit and the second pin, and arranged for generating a determining signal according to the first signal inputted to the first pin and a second signal received from the second pin. The determining unit is coupled to the logic unit, and arranged for determining the connection status between the first pin and the second pin according to the determining signal.

7 Claims, 8 Drawing Sheets

DETECTING CIRCUIT AND DETECTING METHOD FOR DETERMINING CONNECTION STATUS BETWEEN FIRST PIN AND SECOND PIN

BACKGROUND OF THE INVENTION

1. Field of the Invention

The embodiments of the present invention relate to a method for determining the connection between pins of a chip, and more particularly, to a method that utilizes phase difference to determine the connection status between a first pin and a second pin.

2. Description of the Prior Art

In general, before a chip manufacturer delivers chips to customers, each pin on the chips undergoes an open/short circuit test. Under normal operations, when the customers weld chips on printed circuit boards (PCBs), some soldering problems might happen such as void solder or stray solder spatters might cause pins of the chip to be open-circuited or short-circuited, which makes the chip fail to operate normally. The chip manufacturer must test final PCB products in other ways such as designing a fixture, to select PCB products with defects.

Therefore, it is necessary to provide a method for detecting final PCB products in a low cost way to reduce the total cost of manufacturing PCBs and improve the yield rate thereof to minimize the possibility of customers rejecting the products.

SUMMARY OF THE INVENTION

Therefore, one of the objectives of the present invention is to provide a detecting method and detecting circuit for utilizing a phase difference to determine the connection status between a first pin and a second pin, to solve the aforementioned problem.

According to an embodiment of the present invention, a detecting circuit for determining a connection status between a first pin and a second pin is provided. The detecting circuit includes a signal generation unit, a logic unit and a determining unit. The signal generation unit is coupled to the first pin, and arranged for generating a first signal to the first pin. The logic unit is coupled to the signal generation unit and the second pin, and arranged for generating a determining signal according to the first signal inputted to the first pin and a second signal received from the second pin. The determining unit is coupled to the logic unit, and arranged for determining the connection status between the first pin and the second pin according to the determining signal.

According to another embodiment of the present invention, a method for detecting a connection status between a first pin and a second pin is provided. The method includes generating a first signal to the first pin, generating a determining signal according to the first signal inputted to the first pin and a second signal received from the second pin, and determining the connection status between the first pin and the second pin according to the determining signal.

These and other objectives of the present invention will no doubt become obvious to those of ordinary skill in the art after reading the following detailed description of the preferred embodiment that is illustrated in the various figures and drawings.

DETAILED DESCRIPTION

Some phrases are referring to specific elements in the present specification and claims, please notice that the manufacturer might use different terms to refer to the same elements. However, the definition between elements is based on their functions instead of their names. Further, in the present specification and claims, the term "comprising" is open type and should not be viewed as the term "consisted of." Besides, the term "electrically coupled" can be referring to either directly connecting or indirectly connecting between elements. Thus, if it is described in the below contents of the present invention that a first device is electrically coupled to a second device, the first device can be directly connected to the second device, or indirectly connected to the second device through other devices or means.

Figure 1:
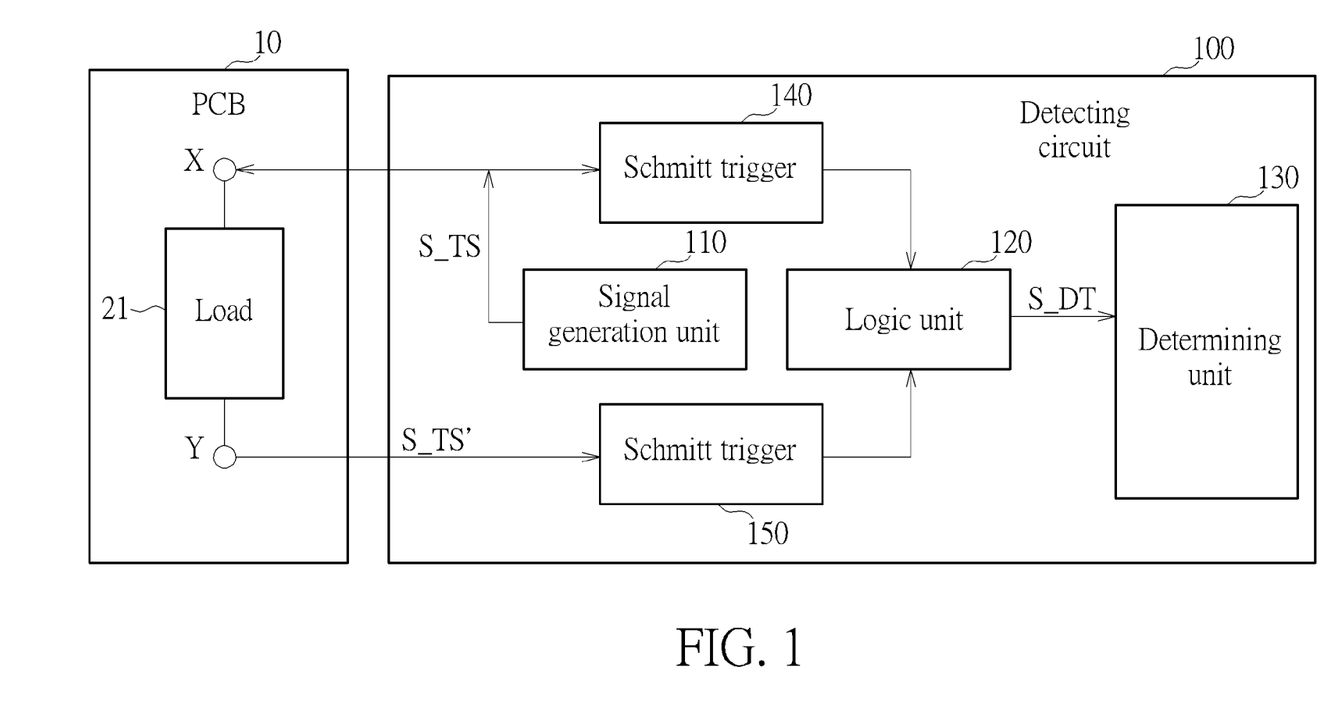
FIG. 1 is a diagram illustrating a detecting circuit according to an embodiment of the present invention.

Please refer to FIG. 1, which is a diagram illustrating a detecting circuit 100 according to an embodiment of the present invention. In FIG. 1, a chip on a PCB 10 has a pin X and a pin Y. It is possible that the pin X is connected to the pin Y through a load 21. In this embodiment, the detecting circuit 100 includes, but not limited to, a signal generation unit 110, a logic unit 120, a determining unit 130 and a plurality of Schmitt triggers 140 and 150. The signal generation unit 110 is coupled to the pin X, and used for generating a first signal (e.g. a detecting signal S_TS) to the pin X. Meanwhile, a corresponding second signal (e.g. a comparison signal S_TS') will be generated at the pin Y. For example, if the pin X is connected to the pin Y through the load 21, the comparison signal S_TS' will be a delayed signal generated due to delaying the detecting signal S_TS for a time period of 1/RC, wherein R denotes the resistance of the load 21, and C denotes parasitic capacitance between the pin X and the pin Y. The logic unit 120 is coupled to the signal generation unit 110 and the pin Y, and arranged for generating a determining signal S_DT according to the phase difference between the detecting signal S_TS and the comparing signal S_TS'. For example, the logic unit 120 can be implemented by a logic circuit such as an exclusive-or (XOR) gate or an exclusive-nor (XNOR) gate. The determining unit 130 is coupled to the logic unit 120, and arranged for determining the connection status between the pin X and the pin Y according to the determining signal S_DT. Please notice that the detecting signal S_TS can be a periodic square wave, a periodic triangular wave, a periodic sinusoidal wave or a step signal. However, the present invention is not limited thereto. Besides, in another embodiment of the present invention, to transform the detecting signal S_TS and the comparing signal S_TS' into digital signals with low noise, the Schmitt triggers 140 and 150 can be respectively added to the path transmitting the detecting signal S_TS and the path transmitting the comparing signal S_TS' to cancel the noise interference. That is, the pin X is coupled to the logic unit 120 through the Schmitt trigger 140, and the pin Y is coupled to the logic unit 120 through the Schmitt trigger 150. The generated digital signals with low noise are then processed by the following logic unit 120. However, the Schmitt triggers are optional, and may be omitted in an alternative design.

Figure 2A:
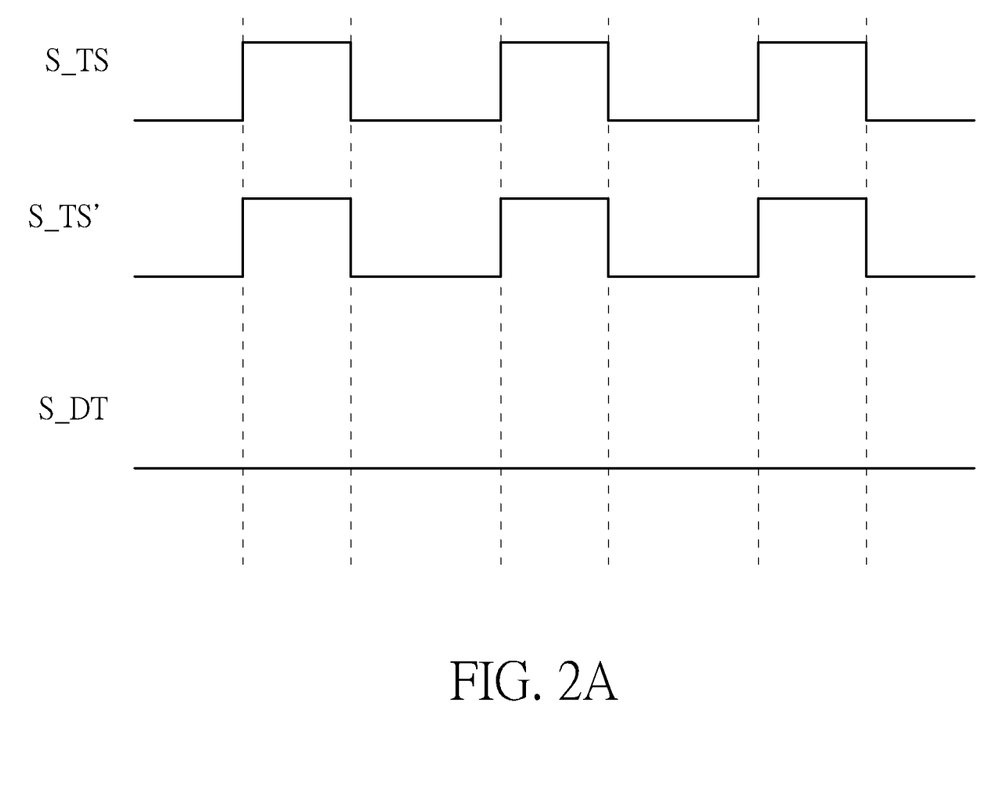
FIG. 2A is a diagram illustrating an example that the detecting circuit of the present invention detects the connection between a pin X and a pin Y to be short-circuited.

Please refer to FIG. 2A, which is a diagram illustrating an example that the detecting circuit 100 of the present invention detects the connection between the pin X and the pin Y to be short-circuited. In this embodiment, the detecting signal S_TS is a periodic square wave, and the logic unit 120 is configured as an XOR gate. In the embodiment of FIG. 2A, since the pin X is short-circuited to the pin Y, there is no phase difference between the detecting signal S_TS and the comparing signal S_TS'. That is, the determining signal S_DT generated by the logic unit 120 is an output signal with a logic level "0." Please notice that the logic level of the determining signal S_DT will be "1" if the logic unit 120 is implemented using an XNOR gate. The determining unit 130 can determine the connection between the pin X and the pin Y is short-circuited if the determining signal S_DT has a single logic level, either 0 or 1, only.

Figure 2B:
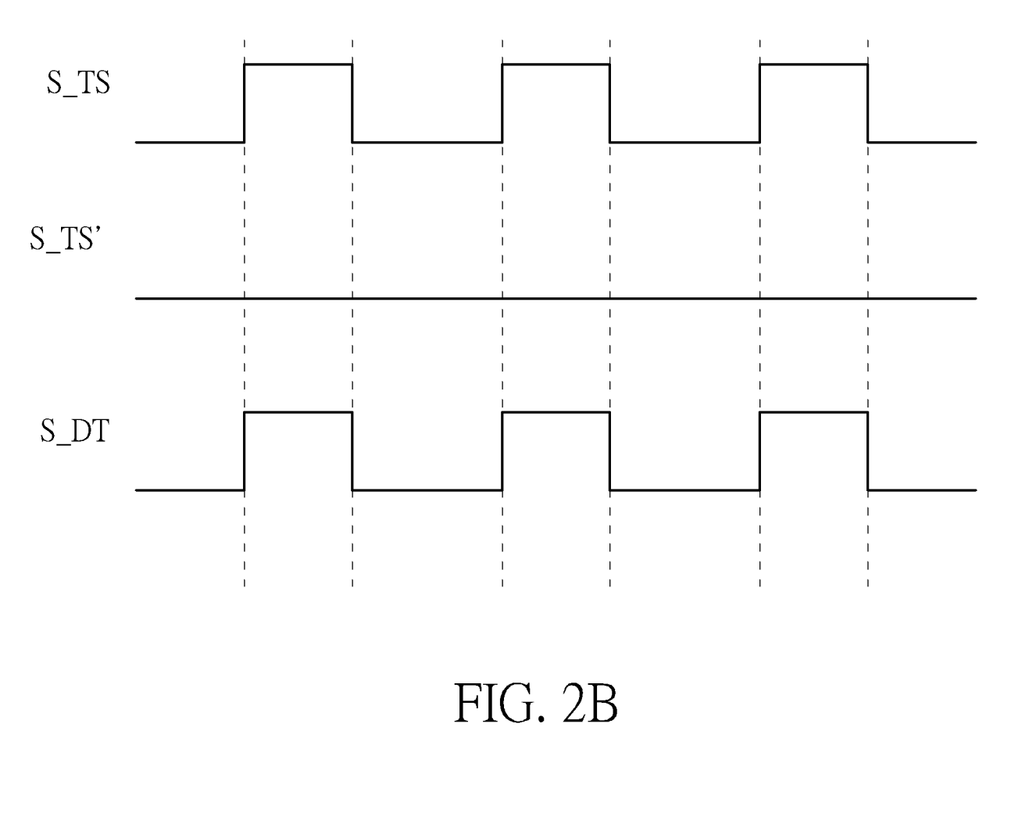
FIG. 2B is a diagram illustrating an example that the detecting circuit of the present invention detects the connection between the pin X and the pin Y to be open-circuited.

Please refer to FIG. 2B, which is a diagram illustrating an example that the detecting circuit 100 of the present invention detects the connection between the pin X and the pin Y to be open-circuited. In this embodiment, the detecting signal S_TS is a periodic square wave, and the logic unit 120 is configured as an XOR gate. In the embodiment of FIG. 2B, since the pin X is open-circuited to the pin Y, the detecting signal S_TS will not be transmitted to the pin Y. In other words, the voltage at the pin Y is floating. In one implementation, a weakly pull down circuit or a weakly pull high circuit can be further connected to the pin Y to define the voltage level of the pin Y. For example, when the pin Y is coupled to a weakly pull down circuit, and the pin X is open-circuited to the pin Y, the pin Y will output a comparison signal S_TS' with a logic level "0". At this time, the determining signal S_DT generated by the logic unit 120 will be the same as the detecting signal S_TS. In other words, the determining unit 130 can determine the connection between the pin X and the pin Y is open-circuited if the characteristic (e.g. frequency) of the determining signal S_DT is the same as that of the detecting signal S_TS.

Figure 2C:
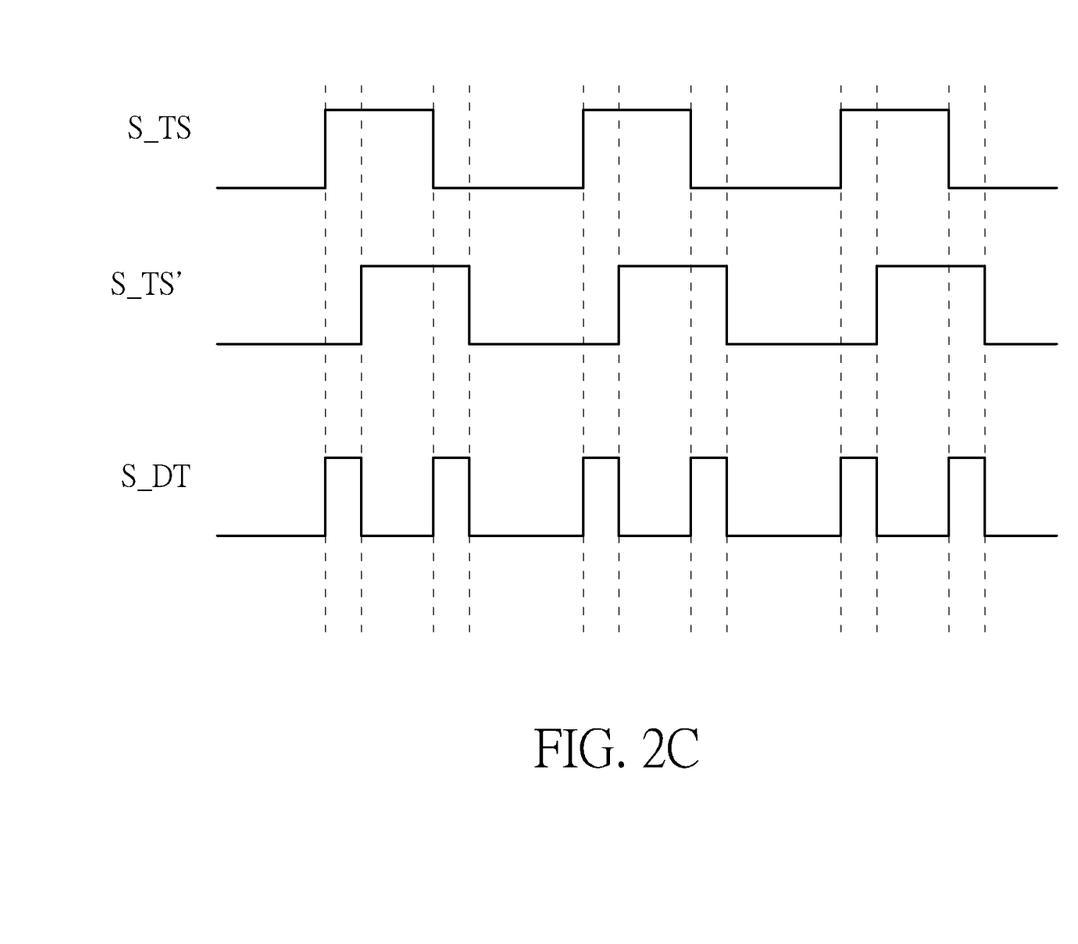
FIG. 2C is a diagram illustrating an example that the detecting circuit of the present invention detects a load connected between the pin X and the pin Y.

Please refer to FIG. 2C, which is a diagram illustrating an example that the detecting circuit 100 of the present invention detects the load 21 connected between the pin X and the pin Y. In FIG. 2C, since the pin X is connected to the pin Y through the load 21, there is a phase difference between the detecting signal S_TS and the comparing signal S_TS'. That is, after the logic unit 120 performs XOR logic operations upon the detecting signal S_TS and the comparing signal S_TS', the frequency of the generated pulse signal (i.e., the determining signal S_DT) is twice that of the detecting signal S_TS or comparing signal S_TS'. In other words, the determining unit 130 can determine whether there is a load connected between the pin X and the pin Y by checking if the frequency of the determining signal S_DT is twice that of the detecting signal S_TS or comparing signal S_TS'.

Figure 2D:
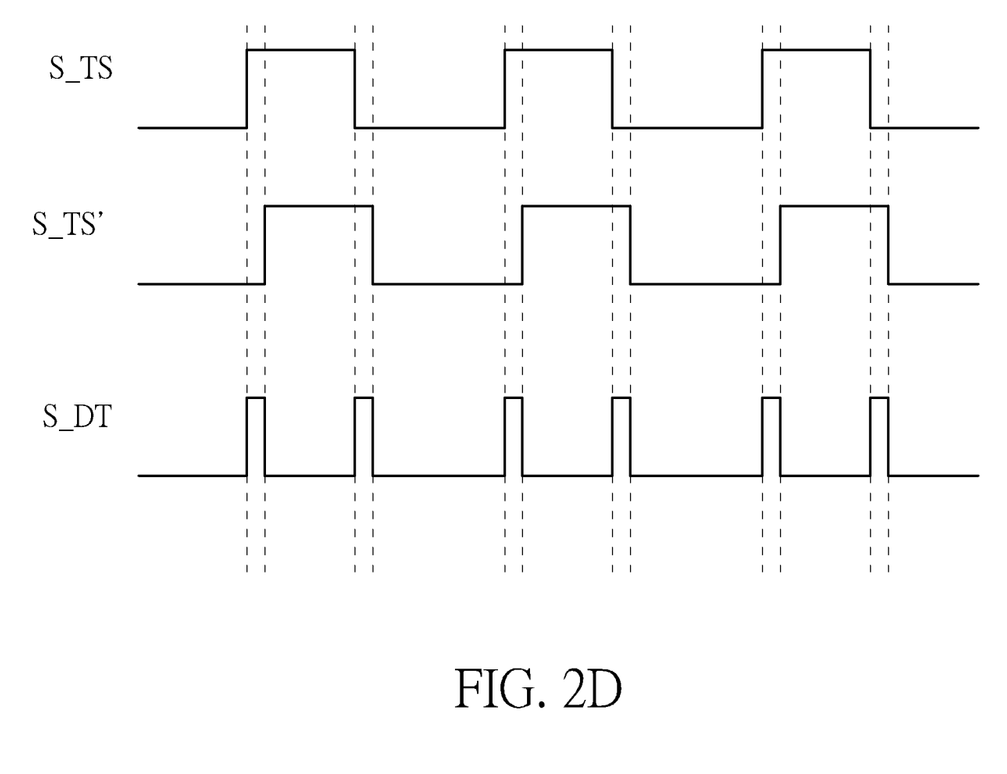
FIG. 2D is a diagram illustrating an example that the detecting circuit of the present invention detects a non-ideal short circuit resistor connected between the pin X and the pin Y.

Please notice that, besides the load 21 originally defined in the specification of the chip, non-ideal short-circuit resistors (i.e., resistors having resistance close to zero) may exist due to bad manufacturing process or welding defects, which may also cause a phase difference between the detecting signal S_TS and the comparing signal S_TS'. Please refer to FIG. 2D, which is a diagram illustrating an example that the detecting circuit 100 of the present invention detects a non-ideal short-circuit resistor 23 connected between the pin X and the pin Y. Since the resistance of the non-ideal short-circuit resistor 23 is usually much lower than that of the load 21, the phase difference between the detecting signal S_TS and the comparing signal S_TS' caused by the non-ideal short-circuit resistor 23 is also very small. It can be known from FIG. 2D that, after the logic unit 20 performs XOR logic operation upon the detecting signal S_TS and the comparing signal S_TS', the pulse width of the generated pulse signal is small and can be regarded as glitch on the determining signal S_DT.

Figure 3:
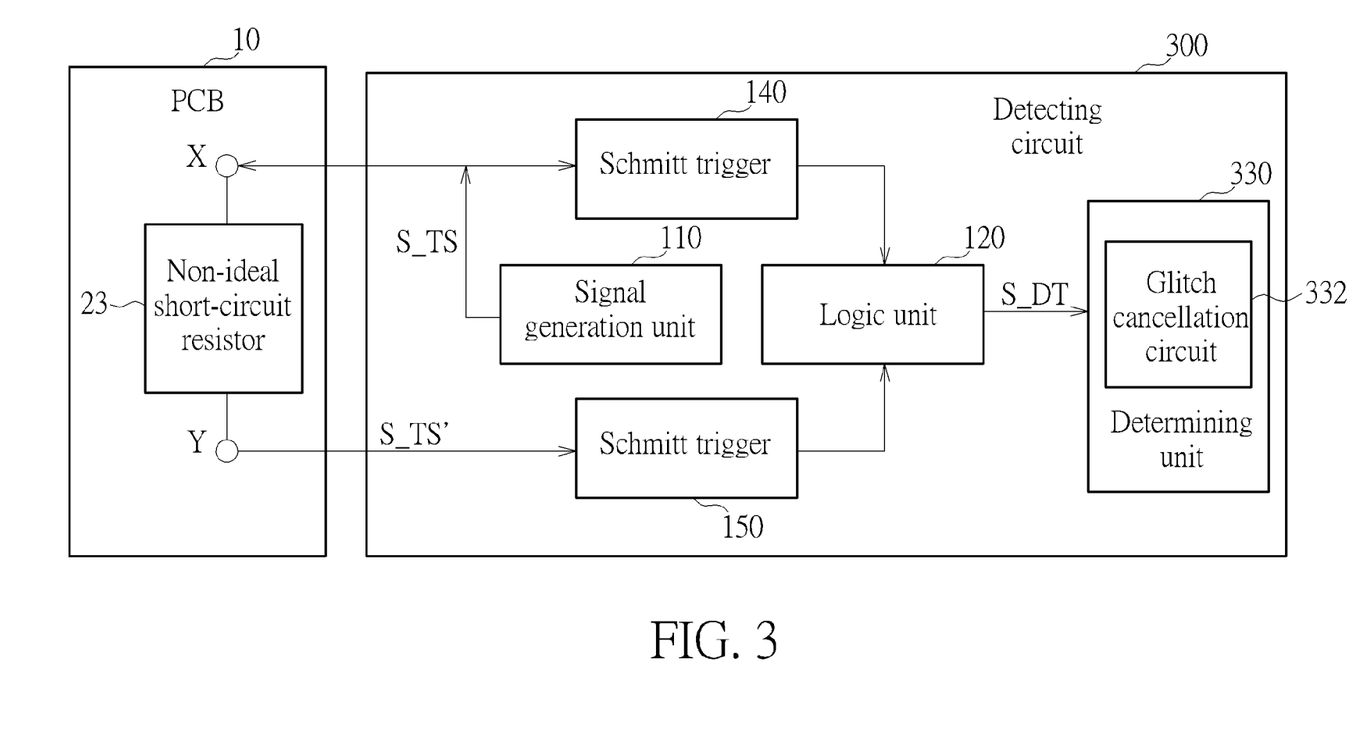
FIG. 3 is a diagram illustrating a detecting circuit according to another embodiment of the present invention.

Please refer to FIG. 3, which is a diagram illustrating a detecting circuit according to another embodiment of the present invention. The difference between the detecting circuits 100 and 300 is that the determining circuit 330 in the detecting circuit 300 further has a glitch cancellation circuit 332 used for cancelling the glitch generated by the non-ideal short-circuit resistor 23, so that the detecting circuit 300 can determine the connection status between the pin X and the pin Y according to a glitch-cancelled determining signal S_DT'. For example, the glitch cancellation circuit 332 may be implemented using a delay circuit and an AND gate. However, the present invention is not limited thereto. Alternatively, the glitch cancellation circuit 332 can be implemented using other circuit configurations.

Figure 4:
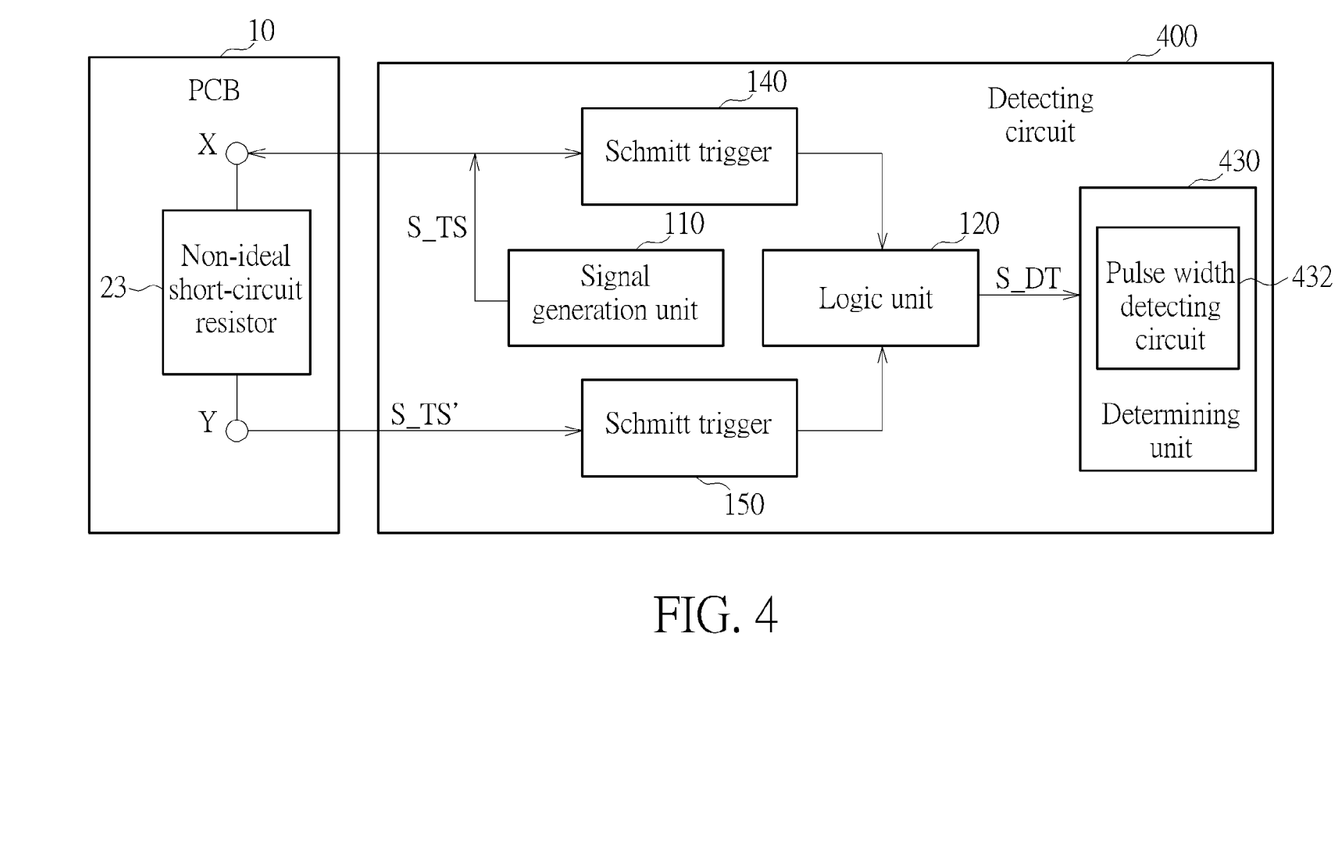
FIG. 4 is a diagram illustrating a detecting circuit according to yet another embodiment of the present invention.

Please refer to FIG. 4, which is a diagram illustrating a detecting circuit according to yet another embodiment of the present invention. The difference between the detecting circuits 100 and 400 is that the determining circuit 430 in the detecting circuit 400 further includes a pulse width detecting circuit 432 used for detecting the pulse width of the determining signal S_DT. As described above, the resistance between the pin X and the pin Y will influence the pulse width of the determining signal S_DT. Therefore, the resistance between the pin X and the pin Y can be obtained through detecting the pulse width of the determining signal S_DT, such that the detecting circuit 400 can determine the connection status between the pin X and the pin Y through the obtained resistance. For example, the pulse width detecting circuit 432 may be implemented using a plurality of delay circuits. However, the present invention is not limited thereto. Alternatively, the pulse width detecting circuit 432 can be implemented using other circuit configurations.

Figure 5:
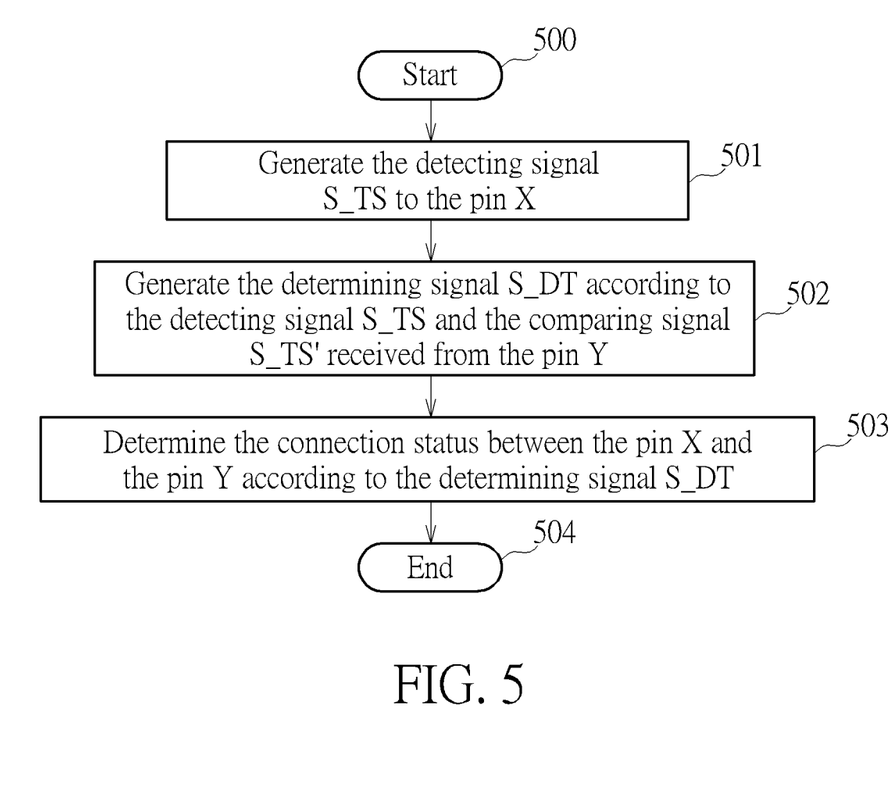
FIG. 5 is a flowchart illustrating a detecting method according to an embodiment of the present invention.

Please refer to FIG. 5, which is a flowchart illustrating a detecting method according to an embodiment of the present invention. If the result is substantially the same, the steps are not required to be executed in the exact order shown in FIG. 5. The method shown in FIG. 8 may be employed by any of the detecting circuits 100, 300 and 400, and can be briefly summarized as follows.

Step 500: Start;
Step 501: Generate the detecting signal S_TS to the pin X;
Step 502: Generate the determining signal S_DT according to the detecting signal S_TS and the comparing signal S_TS' received from the pin Y;
Step 503: Determine the connection status between the pin X and the pin Y according to the determining signal S_DT;
Step 504: end.

The above detecting method illustrates operations of the detecting circuit 100/300/400. As one skilled in the art can understand details of each step after reading above paragraphs directed to the detecting circuit 100/300/400, further description is omitted here for brevity.

In short, the present invention utilizes the phase difference between pins of a chip to determine the connection status between pins in the chip after a PCB product is manufactured, thus reducing the PCB manufacturing cost and also improving the yield rate of PCB products to minimize the possibility of customers rejecting the PCB products.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A detecting circuit for determining a connection status between a first pin and a second pin, comprising:
    a signal generation unit, coupled to the first pin, the signal generation unit arranged for generating a first signal to the first pin;
    a logic unit, coupled to the signal generation unit and the second pin, the logic unit arranged for receiving the first signal directly from the signal generation unit and generating a determining signal according to the first signal and a second signal received from the second pin; and
    a determining unit, coupled to the logic unit, the determining unit arranged for determining the connection status between the first pin and the second pin according to the determining signal.

2. The detecting circuit of claim 1, wherein the first signal generated by the signal generation unit is a periodic square wave, a periodic triangular wave, a periodic sinusoidal wave or a step signal.

3. The detecting circuit of claim 1, wherein the logic circuit detects a phase difference between the first signal and the second signal, to set the determining signal.

4. The detecting circuit of claim 3, wherein the logic circuit comprises:
    an exclusive-or (XOR) gate, arranged for performing an XOR logic operation upon the first signal and the second signal to generate the determining signal; or
    an exclusive-nor (XNOR) gate, arranged for performing an XNOR logic operation upon the first signal and the second signal to generate the determining signal.

5. The detecting circuit of claim 1, wherein when the determining signal has a single logic level only, the determining unit detects a connection between the first pin and the second pin to be short-circuited.

6. The detecting circuit of claim 1, wherein the first signal generated by the signal generation unit is a periodic detecting signal, and when a frequency of the determining signal is twice a frequency of the first signal, the determining unit detects that the first pin is connected to the second pin through a load.

7. The detecting circuit of claim 1, wherein the first signal generated by the signal generation unit is a periodic detecting signal, and when a frequency of the determining signal is equal to a frequency of the determining signal, the determining unit detects a connection between the first pin and the second pin to be open-circuited.

* * * * *